United States Patent
Asano

(10) Patent No.: US 10,910,521 B2
(45) Date of Patent: Feb. 2, 2021

(54) SEMICONDUCTOR LIGHT EMITTING DEVICE

(71) Applicant: Nikkiso Co., Ltd, Tokyo (JP)

(72) Inventor: Hideki Asano, Ishikawa (JP)

(73) Assignee: NIKKISO CO., LTD., Tokyo (JP)

(*) Notice: Subject to any disclaimer, the term of this patent is extended or adjusted under 35 U.S.C. 154(b) by 0 days.

(21) Appl. No.: 16/249,463

(22) Filed: Jan. 16, 2019

(65) Prior Publication Data

US 2019/0221716 A1    Jul. 18, 2019

(30) Foreign Application Priority Data

Jan. 16, 2018 (JP) .................. 2018-004954

(51) Int. Cl.
*H01L 33/44* (2010.01)
*H01L 33/56* (2010.01)
*H01L 33/32* (2010.01)
*H01L 33/14* (2010.01)

(52) U.S. Cl.
CPC .............. *H01L 33/44* (2013.01); *H01L 33/56* (2013.01); *H01L 33/145* (2013.01); *H01L 33/32* (2013.01); *H01L 2224/05599* (2013.01); *H01L 2924/181* (2013.01)

(58) Field of Classification Search
CPC ......... H01L 33/44; H01L 33/56; H01L 33/32; H01L 33/145; H01L 2924/181; H01L 2224/05599
See application file for complete search history.

(56) References Cited

U.S. PATENT DOCUMENTS

2013/0250992 A1* 9/2013 Ohmae ............... H01S 5/3013
                                                     372/44.011
2015/0303358 A1* 10/2015 Ko ....................... H01L 33/501
                                                           257/98

FOREIGN PATENT DOCUMENTS

WO     WO2013105514 A1     7/2013

* cited by examiner

*Primary Examiner* — Patricia D Reddington
(74) *Attorney, Agent, or Firm* — Muncy, Geissler, Olds & Lowe, P.C.

(57) ABSTRACT

A semiconductor light emitting device includes: a light emitting part for emitting ultraviolet light; and a coating part that coats an extraction surface from which the ultraviolet light emitted by the light emitting part is extracted. The coating part includes a resin matrix having a refractive index lower than a refractive index of an inorganic material forming the extraction surface and a hollow part that lowers a refractive index of the coating part as a whole by being dispersed in the resin matrix. The hollow part has an average particle diameter smaller than a peak wavelength of the ultraviolet light emitted by the light emitting part.

11 Claims, 3 Drawing Sheets

SEMICONDUCTOR LIGHT EMITTING DEVICE

CROSS-REFERENCE TO RELATED APPLICATIONS

This application is based upon and claims the benefit of priority from the prior Japanese Patent Application No. 2018-4954, filed on Jan. 16, 2018, the entire contents of which are incorporated herein by reference.

BACKGROUND OF THE INVENTION

1. Field of the Invention

The present invention relates to semiconductor light emitting devices.

2. Description of the Related Art

In the related art, LED devices have been devised that include: an LED chip; a wavelength conversion layer that coats the LED chip, contains phosphor particles and a sealing resin and converts a light of a specific wavelength from the LED chip into a light of another specific wavelength; and an inorganic particle-containing layer that is in contact with the wavelength conversion layer and contains inorganic particles and a binder, wherein the refractive index of the inorganic particles is lower than the refractive index of the binder (see patent document 1). The LED device realizes pseudo white light by mixing a blue light emitted by the LED chip and a yellow light produced by exciting the phosphor of the wavelength conversion layer by a portion the blue light.

Recently, efforts have been made to develop semiconductor light emitting devices capable of emitting ultraviolet light having a wavelength shorter than that of blue light. A semiconductor light emitting device for ultraviolet light like this is configured such that layers such as an n-type layer, an active layer, and a p-type layer each comprised of a nitride-based semiconductor layer are stacked on a substrate in a predetermined order. In a semiconductor light emitting device like this, ultraviolet light emitted by the active layer need be extracted outside via the substrate or the semiconductor layers. However, because the refractive index of ordinary nitride-based semiconductor layers is significantly greater than that of air and because ultraviolet light is absorbed significantly by some of the nitride-based materials (e.g., gallium nitride) forming the semiconductor layers, it is difficult to improve the efficiency of extracting light absent any extra measures.

In this background, attempts have been made to reduce the internal reflection caused by a difference in refractive index across the light emitting surface by sealing the light emitting surface of the semiconductor light emitting device with a resin having a higher refractive index than air.
[Patent Document 1] WO13/105514

As described above, it is possible to reduce the internal reflection on the light emitting surface by coating the light emitting surface of the semiconductor light emitting device with a resin. Moreover, it is desired to select a resin having a proper refractive index in view of the refractive index of the light emitting surface of the light emitting device and the refractive index of air in order to reduce the internal reflection on the light emitting surface of the light emitting device or on the exit surface from which ultraviolet light exits from the resin and to further improve the efficiency of extracting light.

However, the types of resin that have high durability against ultraviolet light are limited so that it is not always possible to select a resin that has a preferable refractive index.

SUMMARY OF THE INVENTION

In this background, one illustrative purpose of the present invention is to provide a novel technology of improving the efficiency of extracting light emitted by a semiconductor light emitting device and durability.

A semiconductor light emitting device according to an embodiment includes: a light emitting part for emitting ultraviolet light; and a coating part that coats an extraction surface from which the ultraviolet light emitted by the light emitting part is extracted. The coating part includes a resin matrix having a refractive index lower than a refractive index of an inorganic material forming the extraction surface and a hollow part that lowers a refractive index of the coating part as a whole by being dispersed in the resin matrix. The hollow part has an average particle diameter smaller than a peak wavelength of the ultraviolet light emitted by the light emitting part.

Optional combinations of the aforementioned constituting elements, and implementations of the invention in the form of methods, apparatuses, and systems may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
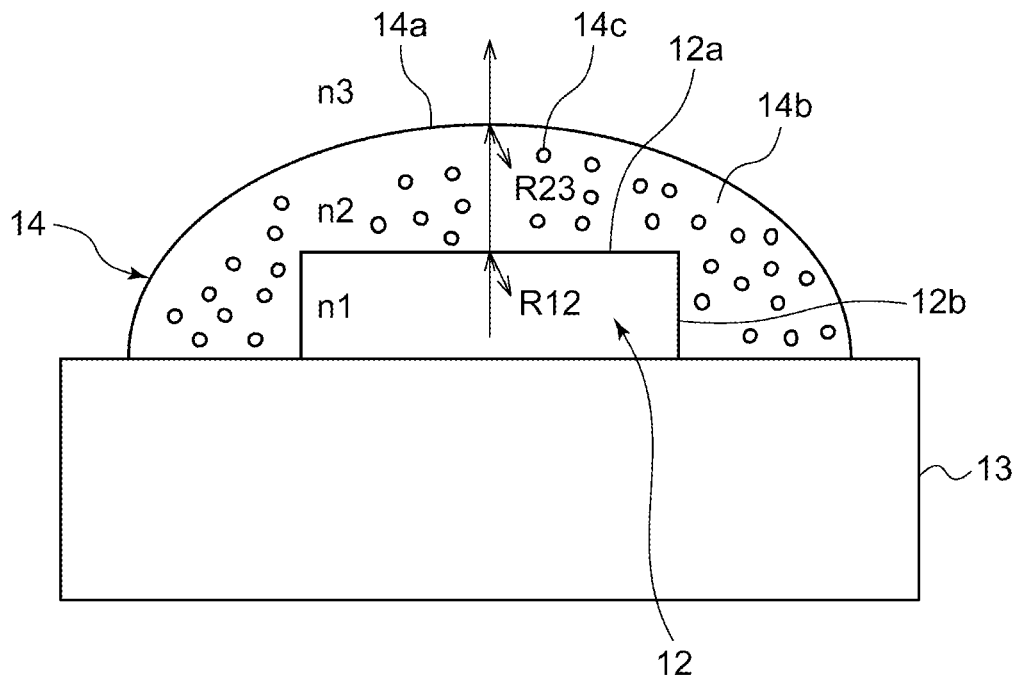
FIG. 1 is a cross-sectional view showing a schematic configuration of a semiconductor light emitting device according to an embodiment.

The invention will now be described by reference to the preferred embodiments. This does not intend to limit the scope of the present invention, but to exemplify the invention.

A semiconductor light emitting device according to an embodiment includes: a light emitting part for emitting ultraviolet light; and a coating part that coats an extraction surface from which the ultraviolet light emitted by the light emitting part is extracted. The coating part includes a resin matrix having a refractive index lower than a refractive index of an inorganic material forming the extraction surface and a hollow part that lowers a refractive index of the coating part as a whole by being dispersed in the resin matrix. The hollow part has an average particle diameter smaller than a peak wavelength of the ultraviolet light emitted by the light emitting part.

Generally, many of inorganic materials that form a light emitting part for emitting ultraviolet light have a larger refractive index than air. Therefore, exposure of a light emitting surface to air increases ultraviolet light that is internally reflected in the light emitting part and reduces the efficiency of extracting light. Thus, according to this embodiment, a difference in refractive index at an interface between the extraction surface and the coating part is reduced and the efficiency of extracting light is improved, by coating the extraction surface with the coating part including the resin matrix. Meanwhile, if the refractive index of the coating part is too high with respect to air, the internal reflection on the exit surface, from which the light exits from the coating part to a space outside (air), will be increased. It is therefore preferred, as described above, that the refractive index of the coating part be of a value in a certain range that is lower than the refractive index of the inorganic material and higher than the refractive index of air. This is addressed by realizing a refractive index, which cannot be realized by configuring the coating part with the resin matrix alone, by dispersing the hollow part in the resin matrix.

The hollow part may have an average particle diameter of 10~100 nm. This prevents the ultraviolet light from being scattered in the hollow part because the average particle diameter of the hollow part is sufficiently smaller than the peak wavelength of the ultraviolet light.

The light emitting part may emit the ultraviolet light having a peak wavelength of 250~350 nm.

The resin matrix may be a silicone-base resin. In this way, the durability against ultraviolet light and the performance of sealing the light emitting part are both met.

The coating part includes the hollow part in an amount of 40~90 wt %. This can lower the refractive index of the coating part properly. Further, by increasing the hollow portion, the linear expansion coefficient of the coating part is lowered and is caused to approximate the linear expansion coefficient of the inorganic material forming the extraction surface. As a result, the tensile stress and compression stress produced at an interface between the extraction surface and the coating part is mitigated, and the occurrence of exfoliation and cracks of the coating part at the interface is reduced.

The extraction surface may be formed by a sapphire substrate or an aluminum nitride substrate.

A description will be given of embodiments of the present invention with reference to the drawings. In the explanations of the figures, the same elements shall be denoted by the same reference numerals, and duplicative explanations will be omitted appropriately. The configuration described below is by way of example only and does not limit the scope of the present invention.

As described above, it is possible to reduce the internal reflection due to a difference in refractive index across the light emitting surface, by sealing the light emitting surface of a semiconductor light emitting device with a resin having a higher refractive index than air. However, resin is poorer than glass or ceramics in terms of durability against light. In the case of semiconductor light emitting devices for emitting ultraviolet light, availability of resins that are durable against ultraviolet light is particularly limited. Naturally, there is no guarantee that a resin having a proper refractive index is available.

We have arrived at an idea of adjusting the refractive index and the linear expansion coefficient by using a filler, while prioritizing the durability of the resin against light. The configuration of the resin matrix and the filler is not uniquely determined. The range of proper configurations may vary depending on the configuration of the light emitting part (the emission wavelength, the material of the extraction surface, etc.).

FIG. 1 is a cross-sectional view showing a schematic configuration of a semiconductor light emitting device according to an embodiment. The semiconductor light emitting device 10 includes a light emitting part 12 for emitting ultraviolet light, a device mounting substrate 13 for mounting the light emitting part, and a sealing resin 14 that coats and seals an extraction surface 12a and a side surface 12b from which the ultraviolet light produced inside the light emitting part 12 is extracted. The extraction surface 12a of the light emitting part 12 is a square of about 0.5~3 mm on one side. For example, the extraction surface 12a is formed by a transparent ceramic substrate made of sapphire or aluminum nitride. A substrate like this has a significantly high refractive index (1.8~2.4). Therefore, improvement in the efficiency of extracting light is attempted by coating the extraction surface 12a with a sealing resin having a refractive index between the refractive index of the substrate and the refractive index of air.

Figure 2:
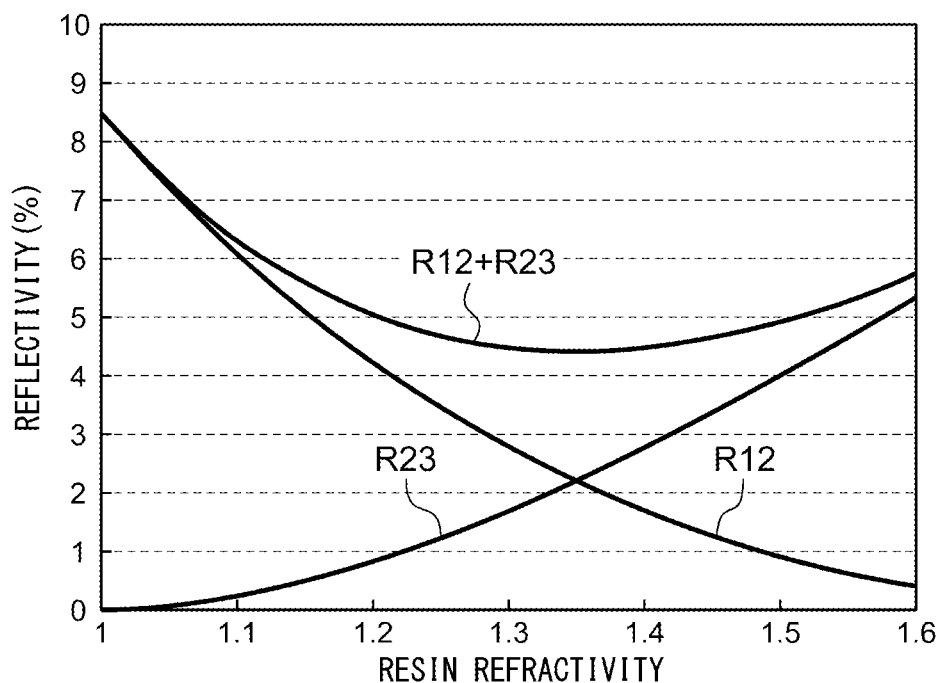
FIG. 2 is a graph showing a relationship between the reflectivity on the light extraction surface, the reflectivity on the exit surface of the sealing resin, and the refractive index of the sealing resin.

FIG. 2 is a graph showing a relationship between the reflectivity on the light extraction surface, the reflectivity on the exit surface of the sealing resin, and the refractive index of the sealing resin. The result shown in FIG. 2 is obtained when the light extraction surface is a sapphire substrate (the refractive index $n_1$=1.82).

The closer the refractive index of the ceramic substrate forming the extraction surface 12a and that of the resin (i.e., the refractive index $n_2$ of the resin is high), the lower the reflectivity R12 on the extraction surface 12a and the higher the efficiency of extracting light. Meanwhile, the higher the refractive index $n_2$ of the resin, the higher the reflectivity R23 on the exit surface 14a (see FIG. 1) and the lower the efficiency of extracting light on the exit surface 14a.

Therefore, it is preferred that the refractive index $n_2$ be in a range in which the sum of the reflectivity R12 and the reflectivity R23 is small, i.e., in a range of about 1.3~1.4. In the case the light extraction surface is a nitride aluminum substrate (the refractive index $n_1$=2.1), the result will be different from the case of a sapphire substrate, but the tendency shown in FIG. 2 remains unchanged.

The result shown in FIG. 2 reveals that the refractive index of the sealing resin 14 is preferably about 1.35, whereas ordinary silicone-based resins mostly have a refractive index of 1.4 or higher. Therefore, silicone-based resin cannot realize a coating part that has an optimum refractive index.

To address this, semiconductor light emitting device 10 according to the embodiment includes, as shown in FIG. 1, a light emitting part 12 for emitting ultraviolet light having a peak wavelength of 250~350 nm; and a sealing resin 14 that embodies a coating part for coating the extraction surface 12a from which the ultraviolet light emitted by the light emitting part 12 is extracted, wherein the sealing resin 14 includes a resin matrix 14b having a refractive index lower than the refractive index of the inorganic material forming the extraction surface 12a, and a hollow part 14c that lowers the refractive index of the coating part as a whole by being dispersed in the resin matrix 14b. The resin matrix 14b is made of a silicone-based resin. In this way, the durability against ultraviolet light and the performance of sealing the light emitting part 12 are both met.

The hollow part 14c has an average particle diameter that is smaller than the peak wavelength of the ultraviolet light emitted by the light emitting part 12. More specifically, the average particle diameter of the hollow part 14c is not less than 10 nm and not more than 400 nm. Preferably, the average particle diameter is 365 nm or smaller, and, more preferably, 310 nm or smaller, which is a range of the peak wavelength of deep ultraviolet light. Further, if the average particle diameter of the hollow part 14c is 200 nm or smaller, and, preferably, 100 nm or smaller, the average particle diameter of the hollow part will be sufficiently smaller than the peak wavelength of the ultraviolet light so that the ultraviolet light is prevented from being scattered in the hollow part.

The material of the hollow part 14c may be adopted from various options but may be exemplified by hollow silica, hollow glass, etc. The refractive index of the hollow portion of the hollow part is substantially 1. Therefore, the hollow part has a function of lowering the refractive index of the layer filled with the hollow part. In this perspective, air bubbles can also function to lower the refractive index. The sealing resin 14 according to the embodiment contains 30 wt % or more of the hollow part. This reduces the refractive index of the coating part properly.

In the semiconductor light emitting device 10 according to the embodiment, the difference in refractive index at an interface between the extraction surface 12a and the sealing resin 14 is reduced and the efficiency of extracting light is improved by coating the extraction surface 12a with the sealing resin 14 including the resin matrix 14b. Meanwhile, if the refractive index of the sealing resin 14 is too high with respect to air, the internal reflection on the exit surface 14a, from which the light exits from the sealing resin 14 to a space outside (air), will be increased. It is therefore preferred, as described above, that the refractive index of the sealing resin 14 be of a value in a certain range that is lower than the refractive index of the inorganic material and higher than the refractive index of air. This is addressed by realizing a refractive index, which cannot be realized by configuring the sealing resin 14 with the resin matrix 14b alone, by dispersing the hollow part 14c in the resin matrix 14b. This improves the efficiency of extracting light in the semiconductor light emitting device 10.

A description will now be given of improvement in the durability of the sealing resin 14. Silicone-base resin, which is highly durable against ultraviolet light, has a linear expansion coefficient that is larger than that of a ceramic substrate by an order of magnitude or two. Therefore, if the sealing resin 14 is subject to potting to coat the light emitting part 12 and then heated and cured, and if the temperature is lowered to the usage environment temperature, stress will remain inside the sealing resin 14.

In other words, an excessive residual stress will be produced at the interface between the sapphire substrate and the silicone resin in the process of lowering the temperature to the usage environment temperature after thermal curing. Moreover, the stress is proportional to the thickness of the sealing resin 14 so that the residual stress will be significantly large if the light emitting part 12 is sealed in a semispherical form as shown in FIG. 1. Thus, a crack could easily occur at a corner of the light emitting part 12 where the stress is easily concentrated due to the shape. Further, an exfoliation may be created between the extraction surface 12a and the sealing resin 14 at the central part of the extraction surface 12a of the light emitting part 12 where the ultraviolet output intensity is particularly high.

A phenomenon like this is pronounced when the linear expansion coefficient of the coating part differs greatly from the linear expansion coefficient of the material of the extraction surface but could occur in the presence of any slight difference of the linear expansion coefficient of the coating part from the linear expansion coefficient of the material of the extraction surface (e.g., twice or more as large as the the linear expansion coefficient of the material of the extraction surface).

It is therefore revealed that, by coating the extraction surface of the light emitting part with a material having a refractive index lower than that of the light emitting part, the efficiency of extracting light is improved, but, on the other hand, the residual stress inside the material of a low refractive index affects the durability.

In this background, we have arrived, based on the above knowledge, at an idea of improving the durability and reliability of a semiconductor light emitting device by reducing the residual stress inside a material of a low refractive index. More specifically, by causing the sealing resin 14 to contain the hollow part 14c in an amount of 40~90 wt %, the linear expansion coefficient of the sealing resin 14 is lowered and so approximate the linear expansion coefficient of the inorganic material forming the extraction surface. As a result, the tensile stress and compression stress produced at an interface between the extraction surface and the coating part is mitigated, and the occurrence of exfoliation and cracks of the coating part at the interface is reduced.

Figure 3:
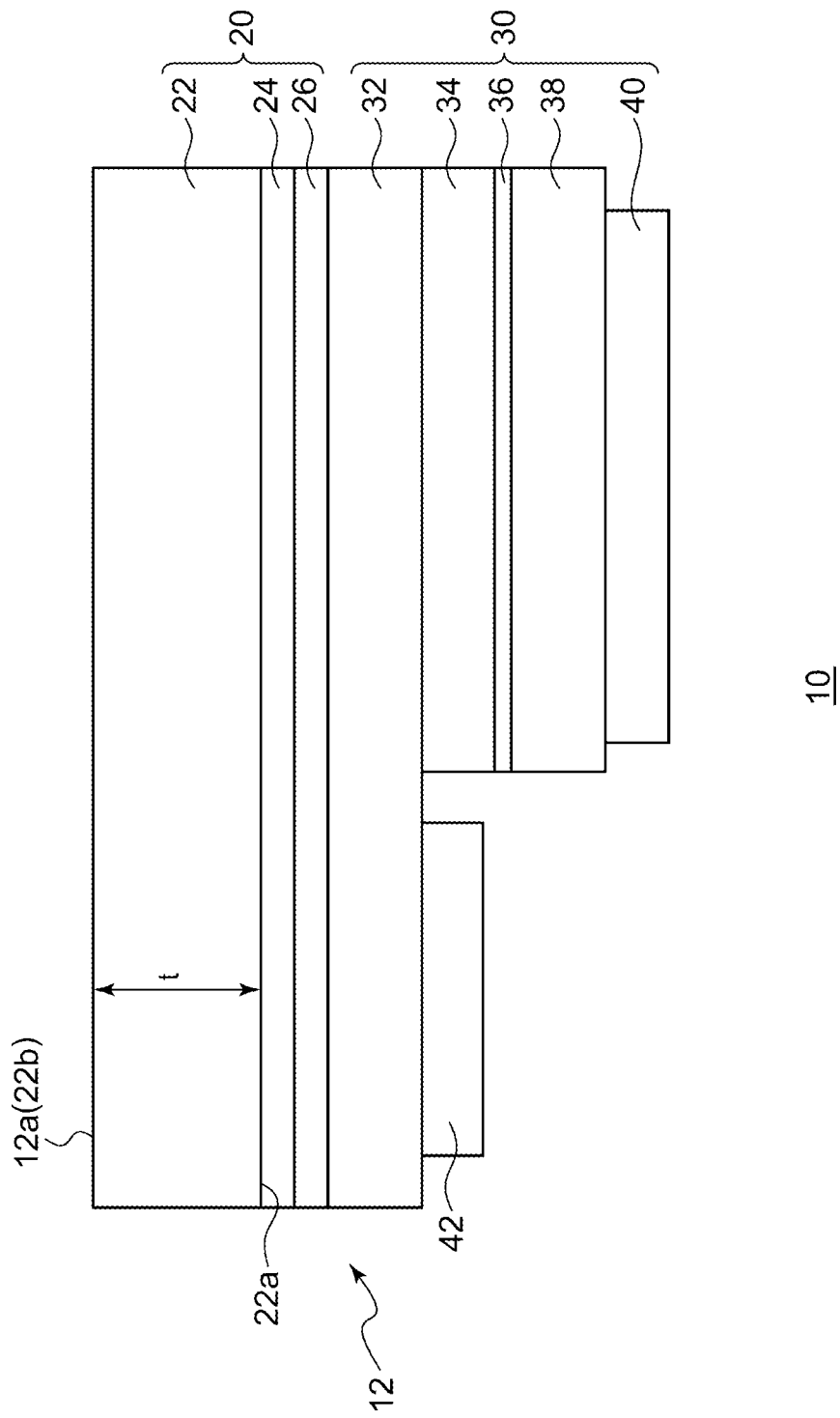
FIG. 3 is a cross-sectional view schematically showing a configuration of the semiconductor light emitting device according to the embodiment.

FIG. 3 is a cross-sectional view schematically showing a configuration of the semiconductor light emitting device according to the embodiment. The features other than the light emitting part 12 are omitted from the illustration in FIG. 3.

The semiconductor light emitting device 10 includes the light emitting part 12 for emitting ultraviolet light. The light emitting part 12 includes a base structure 20 and a light emitting structure 30. The base structure 20 includes a substrate 22, a first base layer 24, and a second base layer 26. The light emitting structure 30 includes an n-type clad layer 32, an active layer 34, an electron block layer 36, a p-type clad layer 38, a p-side electrode 40, and an n-side electrode 42.

The light emitting part 12 is configured to emit "deep ultraviolet light" having a central wavelength of about 365 nm or shorter. To output deep ultraviolet light having such a wavelength, the active layer 34 is made of an aluminum gallium nitride (AlGaN)-based semiconductor material having a band gap of about 3.4 eV or larger. In this embodiment, the case of emitting deep ultraviolet light having a central wavelength of about 310 nm or shorter is specifically discussed.

In this specification, the term "AlGaN-based semiconductor material" mainly refers to a semiconductor material containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The substrate 22 is a sapphire (Al2O3) substrate. The substrate 22 may be an aluminum nitride (AlN) substrate in one variation. The substrate 22 includes a first principal surface 22a and a second principal surface 22b opposite to the first principal surface 22a. The first principal surface 22a is a principal surface that is a crystal growth surface. For example, the first principal surface 22a is the (0001) plane of the sapphire substrate. The second principal surface 22b is a principal surface that embodies the extraction surface 12a from which ultraviolet light is extracted.

The substrate 22 has a thickness t of 1 µm or larger. For example, the substrate 22 has a thickness of about 5 µm, 10 µm, 100 µm, 300 µm, or 500 µm. The first base layer 24 and the second base layer 26 are stacked on the first principal surface 22a of the substrate 22. The first base layer 24 is a layer made of an AlN-based semiconductor material and is, for example, an AlN(HT-AlN) layer gown at a high temperature. The second base layer 26 is a layer made of an AlGaN-based semiconductor material and is, for example, an undoped AlGaN(u-AlGaN) layer.

The substrate 22, the first base layer 24, and the second base layer 26 function as a foundation layer (template) to form the n-type clad layer 32 and the layers above. These layers also function as a light extraction layer for extracting the deep ultraviolet light emitted by the active layer 34 outside and transmit the deep ultraviolet light emitted by the active layer 34. It is preferred that the first base layer 24 and the second base layer 26 be made of an AlGaN-based or AlN-based material having an AlN ratio higher than that of the active layer 34 so as to increase the transmittance for the deep ultraviolet light emitted by the active layer 34. It is further preferred that the first base layer 24 and the second base layer 26 be made of a material having a lower refractive index than the active layer 34.

It is also preferred that the first base layer 24 and the second base layer 26 be made of a material having a higher refractive index than the substrate 22. Given, for example, that the substrate 22 is a sapphire substrate (the refractive index $n_1$=about 1.8) and the active layer 34 is a made of an AlGaN-based semiconductor material (the refractive index $n_3$=about 2.4~2.6), it is preferred that the first base layer 24 and the second base layer 26 be made of an AlN layer (the refractive index $n_2$=about 2.1) or an AlGaN-based semiconductor material (the refractive index $n_2$=about 2.2~2.3) having a relatively higher AlN composition ratio.

The n-type clad layer 32 is an n-type semiconductor layer provided on the second base layer 26. The n-type clad layer 32 is made of an n-type AlGaN-based semiconductor material. For example, the n-type clad layer 32 is an AlGaN layer doped with silicon (Si) as an n-type impurity. The composition ratio of the n-type clad layer 32 is selected to transmit the deep ultraviolet light emitted by the active layer 34. For example, the n-type clad layer 32 is formed such that the molar fraction of AlN is 40% or higher, and, preferably, 50% or higher. The n-type clad layer 32 has a band gap larger than the wavelength of the deep ultraviolet light emitted by the active layer 34. For example, the n-type clad layer 32 is formed to have a band gap of 4.3 eV or larger. The n-type clad layer 32 has a thickness of about 1 µm~3 µm. For example, the n-type clad layer 32 has a thickness of about 2 µm.

The active layer 34 is formed in a partial region on the n-type clad layer 32. The active layer 34 is made of an AlGaN-based semiconductor material and has a double heterojunction structure by being sandwiched by the n-type clad layer 32 and the electron block layer 36. The active layer 34 may form a monolayer or multilayer quantum well structure. The quantum well structure like this can be formed by building a stack of a barrier layer made of an undoped AlGaN-based semiconductor material and a well layer made of an undoped AlGaN-based semiconductor material. To output deep ultraviolet light having a wavelength of 355 nm or shorter, the active layer 34 is formed to have a band gap of 3.4 eV or larger. For example, the AlN composition ratio of the active layer 34 is selected so as to output deep ultraviolet light having a wavelength of 310 nm or shorter.

The electron block layer 36 is formed on the active layer 34. The electron block layer 36 is a layer made of a p-type AlGaN-based semiconductor material and is exemplified by an undoped AlGaN layer. The electron block layer 36 is formed such that the molar fraction of AlN is 40% or higher, and, preferably, 50% or higher. The electron block layer 36 may be formed such that the molar fraction of AlN is 80% or higher or may be made of an AlN-based semiconductor material that does not substantially contain GaN. The electron block layer 36 may be made of an AlGaN-based semiconductor material or an AlN-based semiconductor material doped with magnesium (Mg) as a p-type impurity. The electron block layer 36 has a thickness of about 1 nm~10 nm. For example, the electron block layer 36 has a thickness of about 2 nm~5 nm.

The p-type clad layer 38 is formed on the electron block layer 36. The p-type clad layer 38 is a layer made of a p-type AlGaN-based semiconductor material and is exemplified by a Mg-doped AlGaN layer. The composition ratio of the p-type clad layer 38 is selected such that the molar fraction of AlN in the p-type clad layer 38 is lower than that of the electron block layer 36. The p-type clad layer 38 has a thickness of about 10 nm~1000 nm. For example, the p-type clad layer 38 has a thickness of about 400 nm~600 nm.

The p-side electrode 40 is formed on the p-type clad layer 38. The p-side electrode 40 is made of a material capable of establishing ohmic contact with the p-type clad layer 38. For example, the p-side electrode 40 is formed by a nickel (Ni)/gold (Au) stack structure.

The n-side electrode 42 is provided on the n-type clad layer 32. For example, the n-side electrode 42 is a Ti/Al-based electrode and is formed by, for example, a titanium (Ti)/Al/Ti/Au or Ti/Al/Ni/Au stack structure.

A durability test was conducted in a semiconductor light emitting device in which the sealing resin 14 contains a hollow part (example) and in a semiconductor light emitting device in which a hollow part is not contained.

The sealing resin 14 according to the example includes a mixture of 30 wt % of silicone-based resin and 70 wt % of hollow silica having an average particle diameter of 20 nm and is cured at 180° C. after sealing the light emitting part. The hollow silica used is substantially spherically shaped. Particles having a particle diameter of 16 nm~24 nm occupy 90% or more in the particle size distribution of the hollow silica. The largest thickness of the sealing resin 14 is about 0.5 mm. The peak wavelength of deep ultraviolet light emitted by the light emitting part 12 is about 280 nm.

Figure 4:
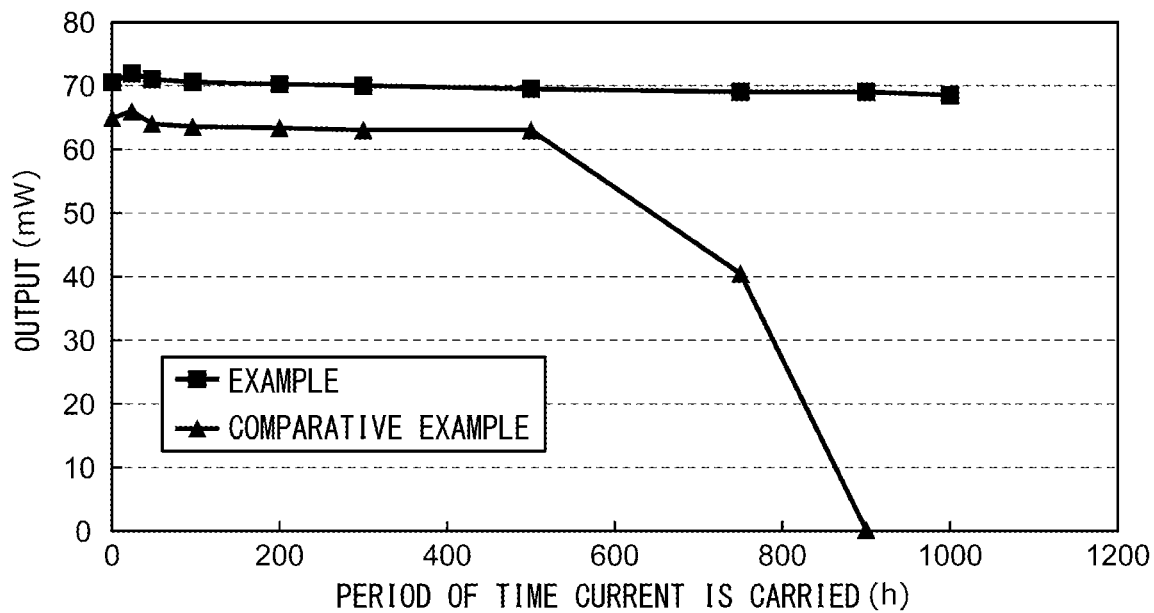
FIG. 4 is a graph showing output variation in the semiconductor light emitting devices according to the example and a comparative example.

FIG. 4 is a graph showing output variation in the semiconductor light emitting devices according to the example and a comparative example. As shown in FIG. 4, the initial output of the semiconductor light emitting device according to the comparative example is about 65 mW, but the sealing resin 14 does not contain the hollow part 14c. For this reason, the output begins to drop after about 500 hours since the device started to carry a current. The device no longer emits light after 900 hours since it started to carry a current. The primary cause of the termination of light emission is degradation in the resin. More specifically, phenomena such as cracking of the sealing resin and exfoliation at the interface between the sealing resin and the light emitting part have been observed during a current-carrying test.

By causing the sealing resin 14 to contain the hollow part 14c, the initial output of the semiconductor light emitting device according to the example exceeds 70 mW. No substantive reduction in the output was observed even after 1000 hours since device started to carry a current.

Figure 5:
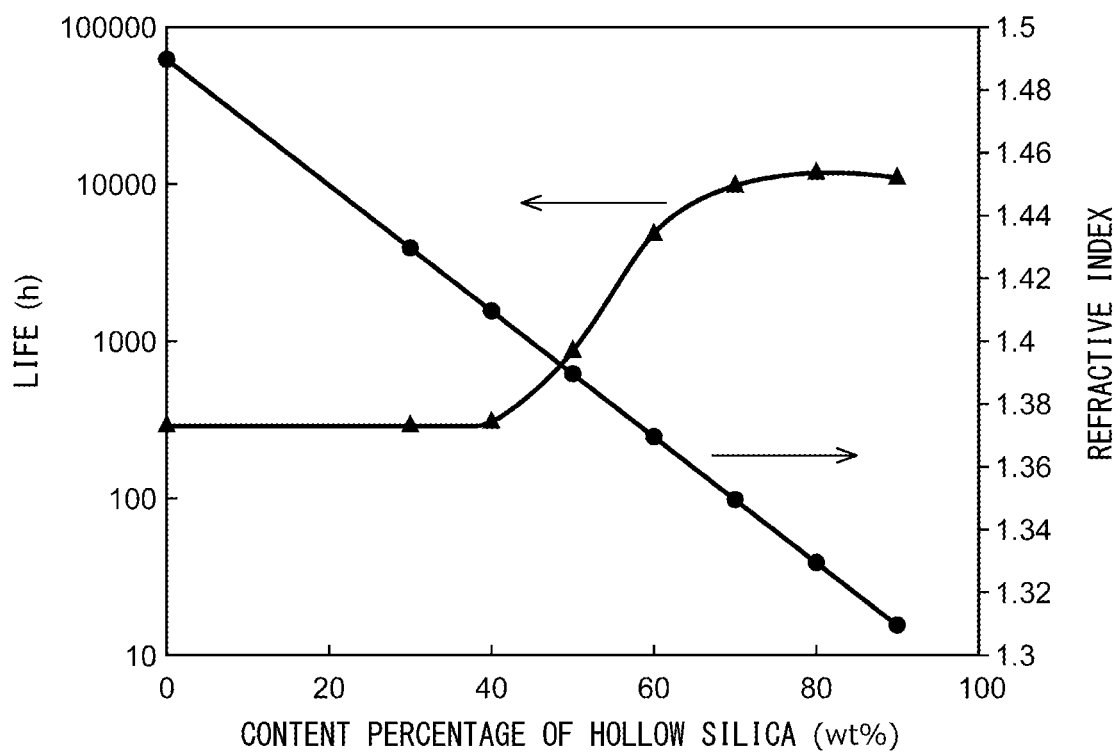
FIG. 5 is a graph showing a relationship between the content percentage of hollow silica, the life of the light emitting device, and the refractive index of the sealing resin.

A description will now be given of a relationship between the content percentage of hollow silica and the life. FIG. 5 is a graph showing a relationship between the content percentage of hollow silica, the life of the light emitting device, and the refractive index of the sealing resin. FIG. 5 reveals that the higher the content percentage of hollow silica, the more the device life is improved. This is because the tensile stress that remains in the sealing resin after thermal curing is reduced and the durability of the sealing resin as a whole is improved due to an increase in the content percentage of hollow silica.

FIG. 5 also shows that the life of the light emitting device begins to grow beyond the content percentage of hollow silica of about 40 wt %. An increase in the life becomes evident at 50 wt % or higher. Further, an increase in the life is pronounced at 60 wt % or higher, and, at least in a range up to about 90 wt %.

Meanwhile, it is preferred that the refractive index of the sealing resin 14 effective to increase the efficiency of extracting light in the semiconductor light emitting device 10 be in a range of about 1.3~1.4, as described above. Therefore, it is preferred that, in the perspective of efficiency of extracting light, the content percentage of hollow silica be 50 wt % or higher, in which range the refractive index is below 1.4, and, more preferably, 60 wt % or higher. Further, when the content percentage of hollow silica is 60 wt % or higher, the life of the light emitting device can be extended significantly, as described above.

Thus, by causing the sealing resin 14 to contain the hollow part 14c, the overall reflection loss at the interface between the extraction surface of the light emitting part and the sealing resin and at the interface between the sealing resin and air in the semiconductor light emitting device according to the embodiment is reduced and the efficiency of extracting light is improved. In addition, by causing the sealing resin 14 to contain the hollow part 14c, the linear expansion coefficient of the sealing resin 14 as a whole is reduced and the residual stress inside the sealing resin 14 is reduced. As a result, cracks and exfoliation of the resin portion caused by the residual stress are inhibited and the durability in terms of output reduction of the semiconductor light emitting device is improved.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

What is claimed is:

1. A semiconductor light emitting device comprising:
   a light emitting part for emitting ultraviolet light; and
   a coating part that coats an extraction surface from which the ultraviolet light emitted by the light emitting part is extracted,
   wherein the coating part includes:
   a resin matrix having a refractive index lower than a refractive index of an inorganic material forming the extraction surface; and
   a hollow part that lowers a refractive index of the coating part as a whole by being dispersed in the resin matrix,
   wherein the hollow part has an average particle diameter smaller than a peak wavelength of the ultraviolet light emitted by the light emitting part, and
   wherein the coating part including the hollow part in an amount of 40~90 wt %.

2. The semiconductor light emitting device according to claim 1, wherein the hollow part has an average particle diameter of 10~100 nm.

3. The semiconductor light emitting device according to claim 1, wherein the light emitting part emits the ultraviolet light having the peak wavelength of 250~350 nm.

4. The semiconductor light emitting device according to claim 1, wherein the resin matrix is a silicone-base resin.

5. The semiconductor light emitting device according to claim 1, wherein the extraction surface is formed by a sapphire substrate or an aluminum nitride substrate.

6. The semiconductor light emitting device according to claim 2, wherein the light emitting part emits the ultraviolet light having the peak wavelength of 250~350 nm.

7. The semiconductor light emitting device according to claim 2, wherein the resin matrix is a silicone-base resin.

8. The semiconductor light emitting device according to claim 3, wherein the resin matrix is a silicone-base resin.

9. The semiconductor light emitting device according to claim 2, wherein the extraction surface is formed by a sapphire substrate or an aluminum nitride substrate.

10. The semiconductor light emitting device according to claim 3, wherein the extraction surface is formed by a sapphire substrate or an aluminum nitride substrate.

11. The semiconductor light emitting device according to claim 4, wherein the extraction surface is formed by a sapphire substrate or an aluminum nitride substrate.

* * * * *